United States Patent

[11] 3,590,341

[72] Inventor William H. Preston
Watchung, N.J.
[21] Appl. No. 753,367
[22] Filed Aug. 19, 1968
[45] Patented June 29, 1971
[73] Assignee KMC Semiconductor Corporation
Long Valley, N.J.

[54] MICROWAVE TRANSISTOR PACKAGE
8 Claims, 5 Drawing Figs.

[52] U.S. Cl. .......... 317/235, 317/234
[51] Int. Cl. .......... H01l 1/08, H01l 1/14
[50] Field of Search .......... 317/234, 235, 235 E, 235 F, 235 G, 235 N

[56] References Cited

UNITED STATES PATENTS

| | | | |
|---|---|---|---|
| 3,283,224 | 11/1966 | Erkan | 317/234 |
| 3,311,798 | 3/1967 | Gray | 317/234 |
| 3,509,434 | 4/1970 | Yanai et al. | 317/235 |
| 3,518,504 | 6/1970 | Dietrich | 317/234 |

*Primary Examiner*—James D. Kallam
*Attorney*—Buckles and Bramblett

ABSTRACT: A microwave transistor package is disclosed which utilizes a disc of beryllium oxide. One surface of the disc is metallized to form a symmetrical pattern of four contacts. These include a collector contact and a base contact oppositely disposed along one diameter of the disc. The remaining two contacts are oppositely disposed along a second diameter perpendicular to the first. They are substantially wider than the collector and base contacts and comprise double emitter contacts. The transistor is mounted on the collector contact and a wire connects its base to the base contact. An emitter wire connects both of the metallized emitter contacts and its midpoint is connected to the emitter of the transistor. The package is hermetically sealed by means of a beryllium oxide cap enclosing the transistor and "glassed" to the disc.

PATENTED JUN 29 1971 3,590,341

INVENTOR.

William H. Preston

BY

Wooster, Davis & Cifelli

ATTORNEYS.

MICROWAVE TRANSISTOR PACKAGE

BACKGROUND OF THE INVENTION

The manufacture of transistors designed to operate at microwave frequencies—for example, in the vicinity of 2 GHz.—presents a number of constructional and operational problems. These are the result of a number of factors, such as the extremely small size of the transistor as dictated by the high frequency application. Furthermore, the package should be symmetrical and should be electrostatically shielded to the greatest possible extent. In addition, the leads should be as short as possible and there should be no sharp discontinuities, for example, from a strip line circuit into and out of the transistor. Also, it would be desirable if such a package could be placed in a strip line or other circuit in such a manner that minor displacements of the package from its ideal location would not change the overall impedance to ground. Finally the package should be hermetically sealed.

None of the prior art transistor packages achieve all these desired objectives. One of the basic reasons for this failure is the fact that transistors require three connections, namely to the emitter, collector, and base. It thus becomes substantially impossible to manufacture a three lead package with the desired amount of symmetry.

SUMMARY OF THE INVENTION

In accordance with the present invention, there is provided a transistor package having a nonconductive support member. First and second metallized regions on the support member define a substantially linear collector contact and a substantially linear base contact which are aligned with, but spaced from, one another. Third and fourth metallized regions on opposite sides of the collector and base contacts define a pair of emitter contacts. These emitter contacts are aligned with one another and are substantially perpendicular to the alignment of the collector and base contacts. Furthermore, the width of these emitter contacts is substantially greater than the width of the collector and base contacts. A transistor is mounted with its collector region on the collector contact. A base conductor connects the base region of the transistor to the base contact and an emitter conductor interconnects the emitter contacts and is connected at its midpoint to the emitter region of the transistor.

BRIEF DESCRIPTION OF THE DRAWING

The manner in which the objects of this invention are achieved will be more apparent from the following description, the appended claims and the FIGS. of the attached drawing wherein:

DESCRIPTION OF THE PREFERRED EMBODIMENT

Figure 1:
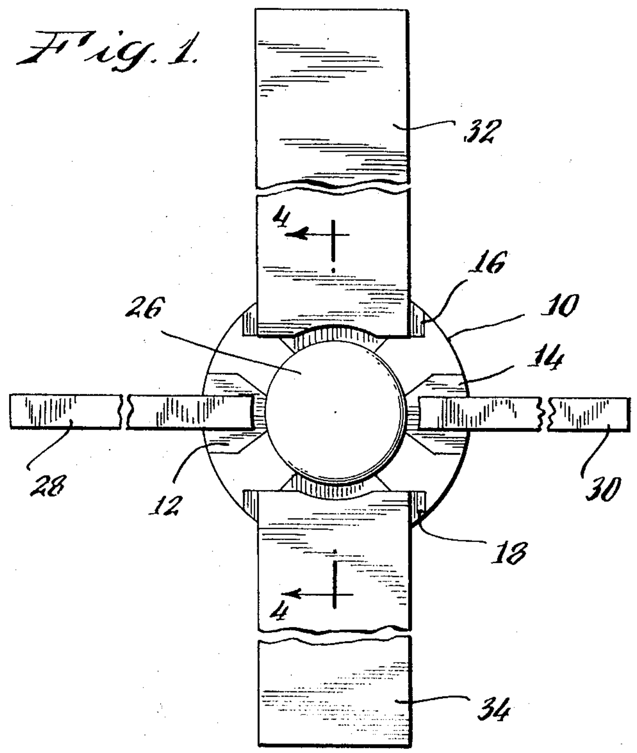
FIG. 1 is a top view of a microwave transistor package in accordance with this invention.
Figure 4:
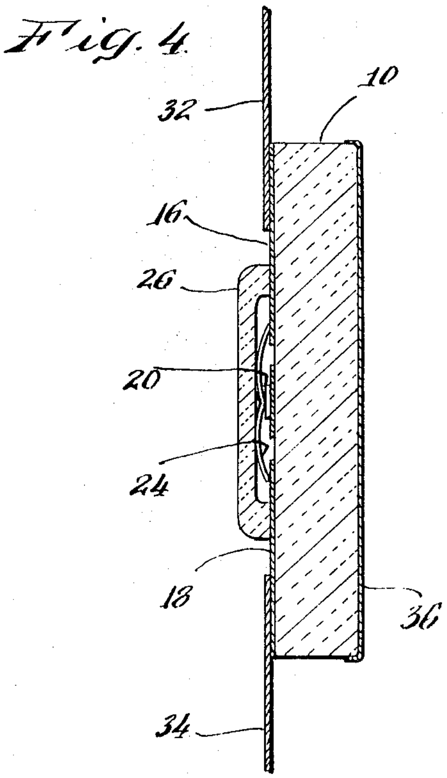
FIG. 4 is an enlarged cross section taken substantially along the line 4—4 of FIG. 1, some portions being exaggerated for ease of illustration.
Figure 2:
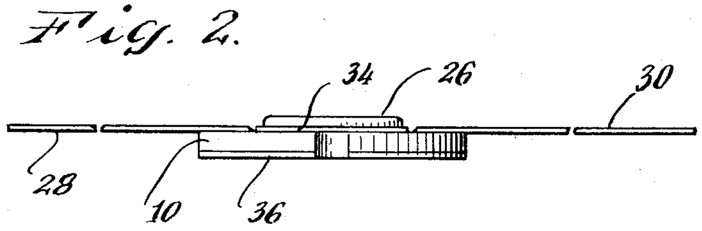
FIG. 2 is a front view of the package of FIG. 1.
Figure 3:
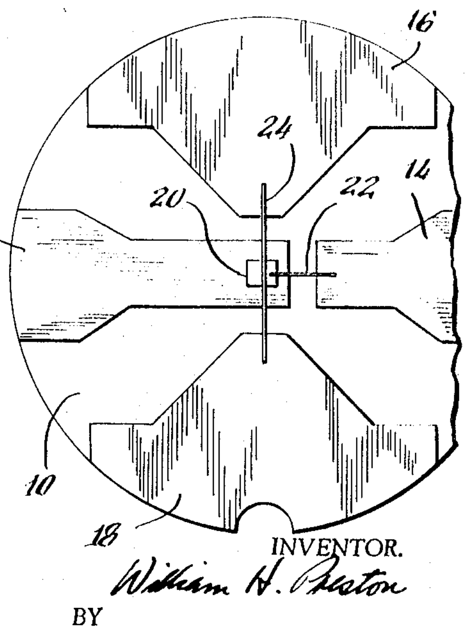
FIG. 3 is a top view of the disc-shaped support member with the external leads and the cap removed.

With particular reference to FIGS. 1—4, there is illustrated a transistor package comprising a disc-shaped support member 10 of beryllium oxide. The support member is provided on its upper surface with a pattern of four metallized regions, as shown in FIG. 3. These regions form a collector contact 12, a base contact 14, and a pair of emitter contacts 16, 18. Several important features should be noted with respect to the shape of these contacts. First, they form a nearly symmetrical configuration to achieve one of the objects of this invention. Secondly, each of the contacts is widened at the periphery of the disc to provide a suitable area for the attachment of leads. Finally, the emitter contacts 16, 18 are a pair, rather than a single contact as in the prior art, and are considerably wider than the collector and base contacts so as to provide electrostatic shielding for the collector and base. The transistor 20 is mounted with its collector in contact with the collector contact 12. A base wire 22 connects the base of the transistor to the base contact 14 and an emitter wire 24 extends between the emitter contact pair 16, 18 and is connected at approximately its midpoint to the emitter of transistor 20. Positioned atop the disc enclosing the transistor and the inner ends of the metallized contacts is a beryllium oxide cap 26. When the package is assembled, heat is applied, causing the beryllium oxide cap 26 to fuse to the support member 10 and its metallized portions to thereby provide a glass media between the cap and support member to hermetically seal the assembly.

For some applications, such as hybrid circuits, the package may be complete as thus far described. More commonly, however, suitable leads will be required and these are attached by silver solder to the collector, base, and emitter contacts. Illustrated in these figures are the relatively narrow collector lead 28, the base lead 30, and emitter leads 32, 34. In addition, the back surface of the support member is metallized, as at 36.

It is believed that the advantages of this invention will now become apparent to those skilled in the art. The symmetry of the arrangement will be clearly apparent from FIGS. 1 and 3. Furthermore there are no sharp discontinuities into and out of the transistor. The emitter connection, in particular, overcomes the usual prior art difficulties in this regard by providing a pair of opposed, diametrically aligned emitter leads 32 and 34 interconnected by an emitter wire 24 which extends diametrically of the package and is connected at its midpoint to the transistor. A further important advantage will be apparent when one envisions the placing of the device into a strip line. Even if not exactly centered, the emitter leads 32, 34 being diametrically opposed, provide a substantially constant impedance to ground. For example if in FIG. 1, the package is offset upwardly, the effective length of lead 32 will be slightly shorter. However, the effective length of lead 34 will be slightly greater, thereby maintaining a relatively constant overall impedance.

Figure 5:
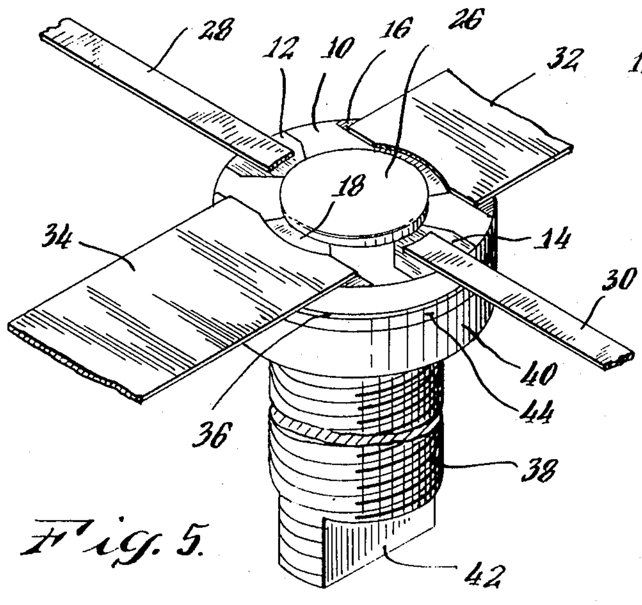
FIG. 5 is a perspective view of a modified form of the package of this invention.

In FIG. 5, there is illustrated a modification of the package of this invention. This modification is substantially similar to that of FIGS. 1—4 and similar reference numerals are used. However, in this modification the package is mounted on a heat sink, in this case a threaded copper stud 38 having an enlarged head 40 and an alignment portion 42. The connection between the package and the stud is made by brazing and includes a fillet 44 between the copper head 40 and the metallized back surface 36. By means of this arrangement, a great deal of heat dissipation may be achieved.

The geometry and specific measurements of the metallized regions of the disc may be varied to suit particular applications. However, in one commercial package, the wide and narrow portions, respectively, of the collector and base contacts are 0.060 and 0.025 inch. The emitter contacts are 0.145 inch at their widest dimension and 0.020 inch at their narrowest, the base of the triangular portion being 0.085 inch. The disc itself has a diameter of 0.210 inch.

It is believed that the many advantages of this invention will now be apparent to those skilled in the art. However, it also will be understood that a number of variations and modifications may be made in the invention without departing from its spirit and scope. Accordingly, the foregoing description is to be construed as illustrative only, rather than limiting. This invention is limited only by the scope of the following claims.

What I claim is:

1. A high frequency transistor package which comprises: a nonconductive support member; a first metallized conductive region on said support member defining a substantially linear collector contact; a second metallized conductive region on said support member defining a substantially linear base contact aligned with, but spaced from, said collector contact; third and fourth substantially symmetrical metallized conductive regions on said support member on opposite sides of said collector and base contacts and spaced therefrom defining a pair of emitter contacts, said emitter contacts being aligned with one another substantially perpendicular to the alignment of said collector and base contacts, the widths of said emitter contacts being substantially greater than the widths of said collector and base contacts; a transistor mounted with its collector region on said collector contact and between the emitter contacts; base wire means connecting the base region of said transistor to said base contact; and emitter wire means interconnecting said emitter contacts and connected at substantially its midpoint to the emitter region of said transistor.

2. The package of claim 1 wherein: a collector lead strip is connected to said collector contact; a base lead strip is connected to said base contact; and first and second emitter lead strips are connected, respectively, to each of said pair of emitter contacts, all of said lead strips extending radially outward from said support member with their axes substantially 90° from one another.

3. The package of claim 2 wherein said transistor and wire means are enclosed by a cap hermetically sealed to said support member.

4. The package of claim 3 wherein said support member is a disc.

5. The package of claim 1 wherein said transistor and wire means are enclosed by a cap hermetically sealed to said support member.

6. The package of claim 5 wherein said sealing is effected by a glass medium between said cap and support member.

7. The package of claim 1 wherein said support member is a disc.

8. The package of claim 1 wherein said support member is mounted on a heat conductive stud.